United States Patent
Bonilla et al.

(10) Patent No.: US 8,368,337 B2
(45) Date of Patent: Feb. 5, 2013

(54) HVAC EQUIPMENT PHASE AND VOLTAGE MONITOR AND CONTROL

(75) Inventors: Absalon Bonilla, Carrollton, TX (US); Carlos O. Chamorro, Plano, TX (US); Richard A. Mauk, Lewisville, TX (US); John P. Stachler, Plano, TX (US)

(73) Assignee: Lennox Industries Inc., Richardson, TX (US)

( * ) Notice: Subject to any disclaimer, the term of this patent is extended or adjusted under 35 U.S.C. 154(b) by 341 days.

(21) Appl. No.: 12/694,421

(22) Filed: Jan. 27, 2010

(65) Prior Publication Data

US 2010/0295493 A1 Nov. 25, 2010

Related U.S. Application Data

(60) Provisional application No. 61/180,405, filed on May 21, 2009.

(51) Int. Cl.
*H02P 1/00* (2006.01)
*H02J 3/02* (2006.01)
*H01H 47/00* (2006.01)
*H04M 1/00* (2006.01)

(52) U.S. Cl. ............. 318/490; 236/51; 307/3; 307/83; 361/152; 379/377; 379/391

(58) Field of Classification Search ............... 318/490
See application file for complete search history.

(56) References Cited

U.S. PATENT DOCUMENTS

| | | | | |
|---|---|---|---|---|
| 5,539,608 | A | * | 7/1996 | Hurley et al. .............. 361/152 |
| 5,982,645 | A | * | 11/1999 | Levran et al. .............. 363/37 |
| 6,741,700 | B1 | * | 5/2004 | Kwan .......................... 379/377 |
| 7,319,280 | B1 | * | 1/2008 | Landry et al. .................. 307/3 |
| 2006/0124759 | A1 | * | 6/2006 | Rossi et al. .................... 236/51 |

* cited by examiner

*Primary Examiner* — Walter Benson
*Assistant Examiner* — Gabriel Agared

(57) ABSTRACT

An HVAC unit includes a transformer and a system controller. The transformer is configured to receive power from a first and a second phase of a three-phase power source and to produce a first reduced-voltage waveform therefrom. The system controller is adapted to sample the reduced voltage waveform to determine a figure of merit of the three-phase power source. The controller is further configured to operate the HVAC unit in response to the figure of merit.

20 Claims, 5 Drawing Sheets

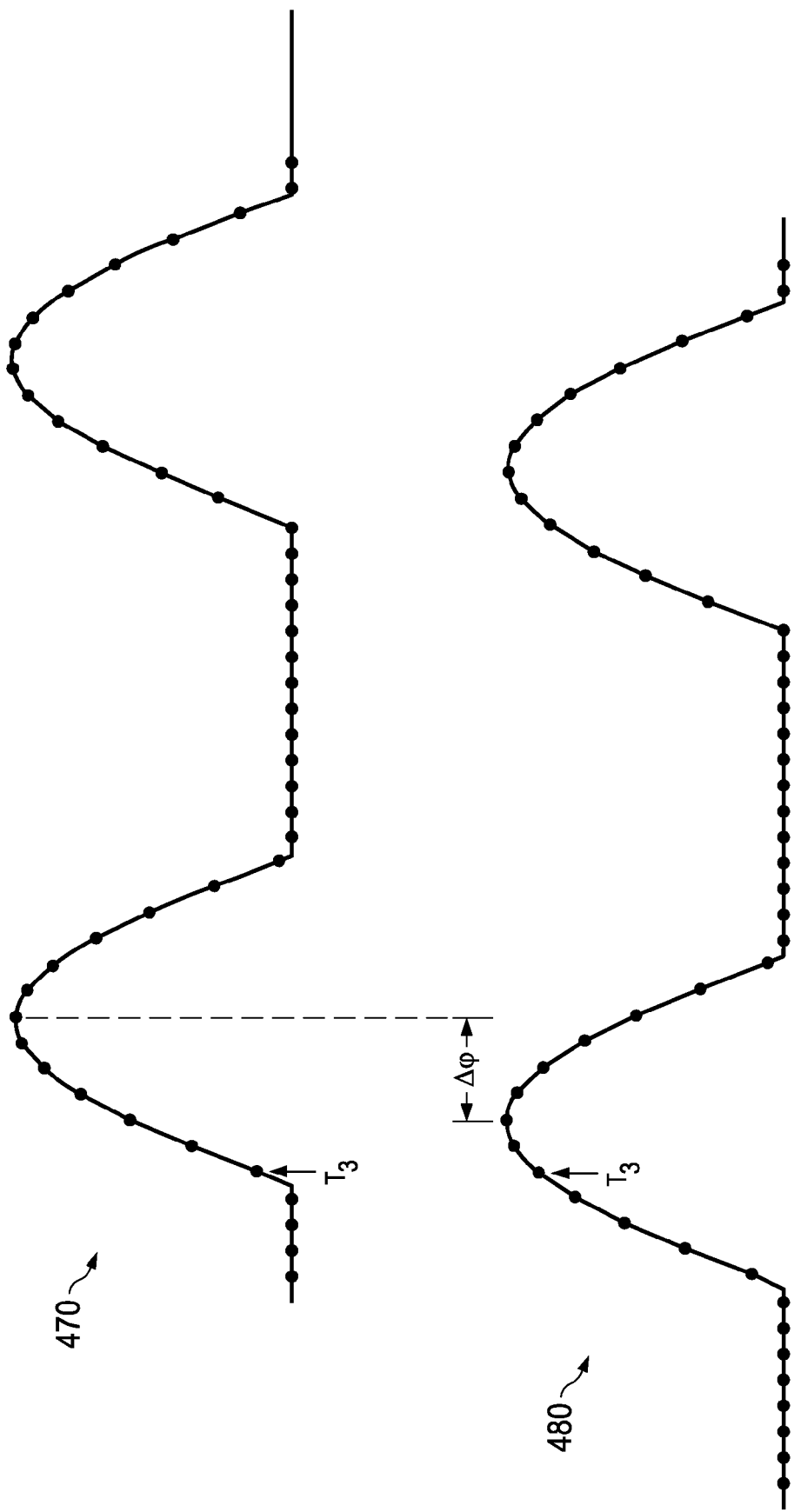

HVAC EQUIPMENT PHASE AND VOLTAGE MONITOR AND CONTROL

CROSS-REFERENCE TO RELATED APPLICATION

This application claims the benefit of U.S. Provisional Application Ser. No. 61/180,405, filed by Mark Beste, et al., on May 21, 2009, entitled "Comprehensive HVAC Control System," commonly assigned with this application and incorporated herein by reference.

TECHNICAL FIELD

This application is directed, in general, to a heating, ventilation and air conditioning (HVAC) and, more specifically, to power and control of HVAC systems.

BACKGROUND

Modern HVAC systems typically employ three-phase power from a local transmission line to operate. HVAC units are often manufactured to be installed to buildings with a variety of voltages and frequencies. Various components of a system may include a compressor or a fan motor. When such components are three-phase components, e.g., configured to operate using all three phases of the available line power, the condition of the voltage supplied by each phase of the line power is critical to the operation of the system. When one or more phases of the line power falls outside an allowable range, or is crossed with another phase, three-phase components may not operate correctly or may be damaged by continued operation. Damaging power conditions can occur, e.g., due to improper installation, service and electrical supply.

SUMMARY

One embodiment, as described herein, provides an HVAC unit having a transformer and a system controller. The transformer is configured to receive power from a first and a second phase of a three-phase power source and to produce a first reduced-voltage waveform therefrom. The system controller is adapted to sample the reduced voltage waveform to determine a figure of merit of the three-phase power source. The system controller is further configured to operate the HVAC unit in response to the figure of merit.

Another aspect provides a method of manufacturing an HVAC system. The method includes configuring an HVAC unit and a system controller. The HVAC unit is configured to receive an input power source and reduce a voltage of the input power source to a reduced voltage. The system controller of the HVAC unit is adapted to sample the reduced voltage to quantify a figure of merit of the input line voltage. The system controller is configured to operate the HVAC unit in response to the figure of merit.

Yet another aspect provides an HVAC power protection system, including a keyed connector block, a keyed connector, and a controller subsystem. The keyed connector block is configured to receive three power phases from a three-phase power source. The keyed connector is configured to mechanically couple to the keyed connector block and thereby electrically couple a first transformer to a first phase and a second phase of the three-phase power source. The controller subsystem is configured to receive a first reduced-voltage waveform derived from an output of the first transformer and sample the first reduced-voltage waveform with an analog to digital converter. A microcontroller is configured to receive a converted voltage from the analog to digital converter and quantify a figure of merit of the three-phase power source. The microcontroller is further configured to operate the HVAC unit in response to the figure of merit.

BRIEF DESCRIPTION

Reference is now made to the following descriptions taken in conjunction with the accompanying drawings, in which:

FIGS. 5 and 7 illustrate sampled half-wave waveforms and figures of merit associated therewith.

DETAILED DESCRIPTION

The present disclosure benefits from the unique recognition that the likelihood of power-related malfunction or damage in an HVAC system may be substantially reduced by an integrated approach to line power distribution and monitoring. The approach includes keyed power connectors and connector blocks to reduce the chance of mis-wiring within the HVAC system, and quantifying one or more key figures of merit to quickly make a control decision in response to a line condition excursion.

Conventional three-phase HVAC power monitors are typically limited to phase characterization input line voltage. Moreover, such a monitor may require additional hardware when the power source to which it is connected provides the line voltage at a higher value than the monitor is designed to accommodate. The limited characterization provided by such modules provides at best an incomplete picture of the status of the input power. Moreover, the response of such a monitor to a phase error is typically limited to disabling the associated HVAC system via a cutoff relay. Thus, there is no means to assess the risk of a power supply excursion and control the HVAC system accordingly.

Figure 1:
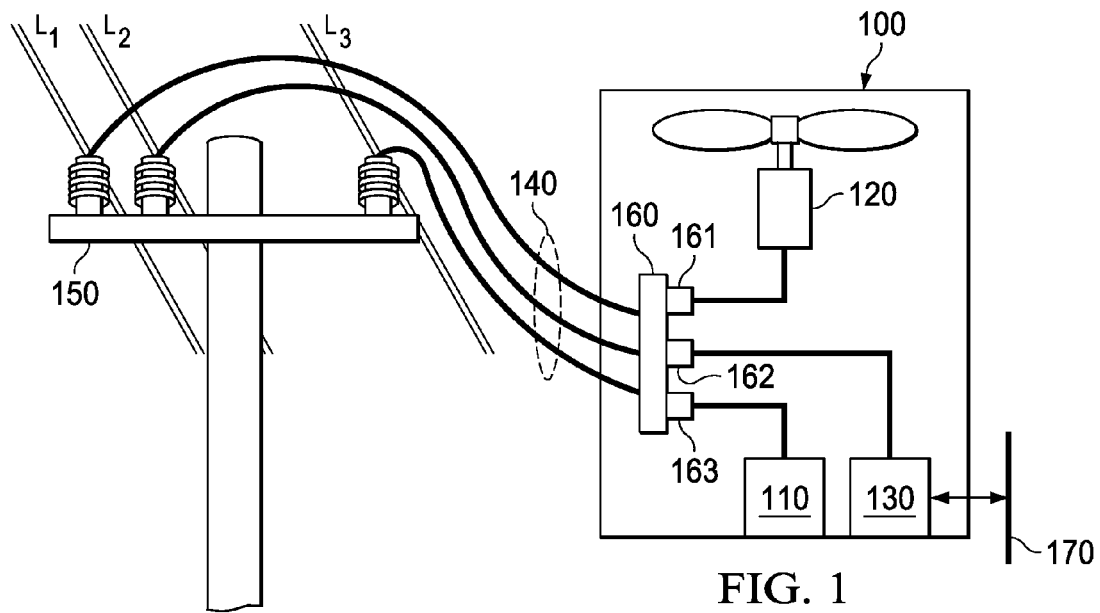
FIG. 1 illustrates an HVAC system of the disclosure connected to a three-phase power source.

Turning initially to FIG. 1, illustrated is an embodiment of the disclosure of an HVAC system, generally designated 100. The HVAC system 100 includes a compressor 110, a fan motor 120 and a system controller 130. The system 100 is a nonlimiting example illustrative of various HVAC systems including without limitation indoor units, outdoor units, and heat pumps. Three-phase power lines 140 provide power to the HVAC system 100. The power lines 140 are referred to for convenience as $L_1$, $L_2$, and $L_3$. Herein, one or more of the power lines 140 may be referred to simply as a "phase" of the three-phase power lines 140. Various components of the HVAC system 100 may be configured to operate using one or more phases of the three-phase power lines 140.

The power lines 140 are illustrated as providing power from a utility pole 150, but the disclosure is not limited to such embodiments. For example, power may be provided by a portable power generation system or locally produced power such as photovoltaics.

When one or more of the lines $L_1$, $L_2$, $L_3$ experience a voltage or phase excursion, or two or more of the lines are switched, components of the HVAC system 100 such as the compressor 110 and the fan motor 120 may cease to operate properly, or may be damaged. For instance, an under-voltage condition on $L_2$ may cause an increased load on $L_1$ and $L_3$ windings of the compressor 110 or the fan motor 120, with damage resulting if these components are operated too long with the under-voltage condition. The compressor 110 and/or fan motor 120 may also be damaged by operating while an over-voltage condition exists. Similarly, for example, the compressor 110 and/or the fan motor 120 may be damaged or rendered inoperable if $L_1$ and $L_2$ are switched. In some cases, the HVAC system 100 may include components that operate using single phase power derived from a local transformer. In these cases, such damage may still be caused by over- and under-voltage conditions.

The lines $L_1$, $L_2$, $L_3$ are illustrated as entering a connector block 160. Connectors 161, 162, 163 may be used to distribute power to the various components of the system 100, including, as illustrated, the compressor 110, the fan motor 120 and the system controller 130. As mentioned, in many cases it is desirable, and may be essential, that $L_1$, $L_2$, and $L_3$ be provided to the various components in the correct order. To reduce the possibility that $L_1$, $L_2$ or $L_3$ will be mis-wired internally to the system 100, the connector block 160 and connectors 161, 162, 163 may be keyed to ensure a desired connector polarity is preserved.

Figure 2:
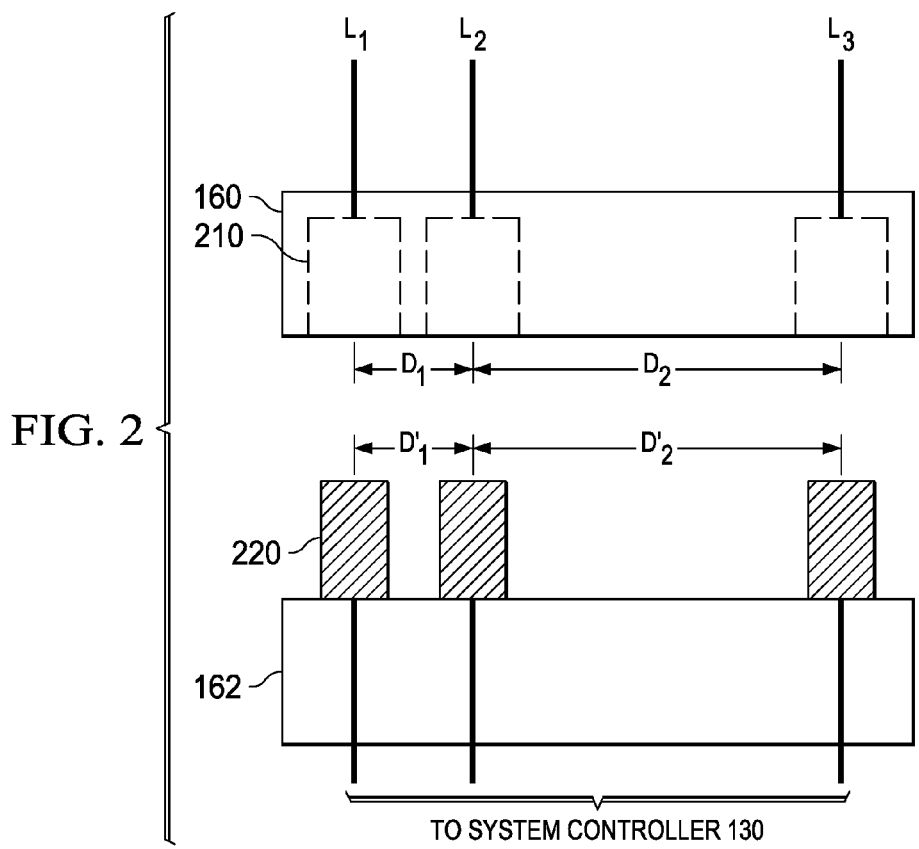
FIG. 2 illustrates a keyed connector and connector block.

FIG. 2 illustrates an embodiment of the connector block 160 and the connector 162 without limitation. The connector block 160 includes receptacles 210, and the connector 162 includes pins 220. A space $D_1$ between the receptacles 210 associated with $L_1$ and $L_2$ is smaller than a space $D_2$ between the receptacles 210 associated with $L_2$ and $L_3$. Similarly, a space $D_1'$ between the pins 220 associated with $L_1$ and $L_2$ is smaller than a space $D_2'$ between the pins 220 associated with $L_2$ and $L_3$. The spacing between the receptacles 210 and the pins 220 is matched, e.g., $D_1=D_1'$ and $D_2=D_2'$. Thus when the connector 162 is mated to the connector block 160 the ordering of $L_1$, $L_2$ and $L_3$ is guaranteed to be preserved at the junction between the connector block 160 and the connector 162. Thus, the connector block 160 and the connector 162 are keyed to each other. Of course, proper hookup to the connector block 160 and the connector 162 is still needed to ensure that $L_1$, $L_2$ and $L_3$ reach the fan motor 120 in the proper order.

Incorrect connections to the connector block 160, or to the connectors 161, 162, 163 may still result in incorrect ordering of $L_1$, $L_2$ and $L_3$ at the system 100 components. Advantageously, the disclosure provides in various embodiments for the detection of incorrect phasing of $L_1$, $L_2$ and $L_3$, as well as characteristics of various figures of merit including, e.g., voltage, phase and frequency excursions.

Figure 3:
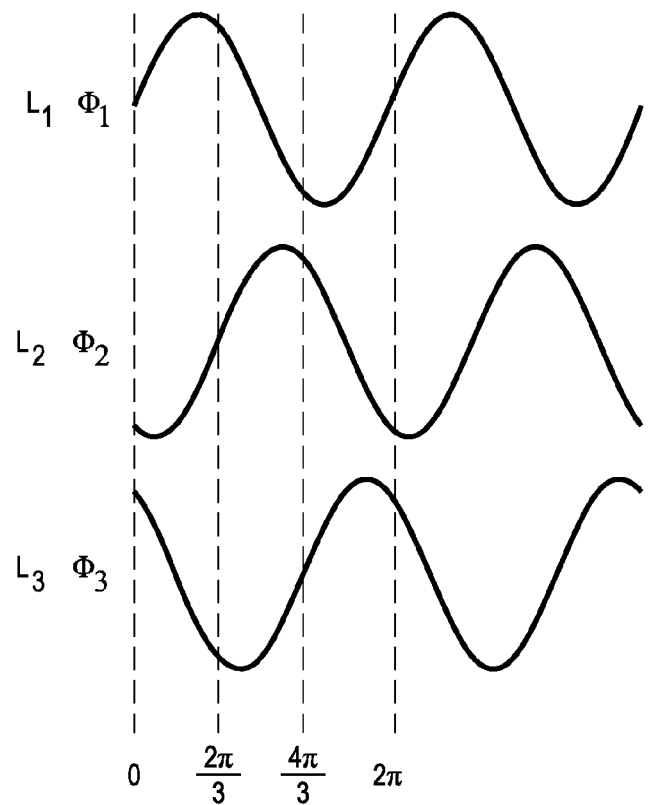
FIG. 3 illustrates phase relationships of three-phase power lines.

Turning briefly to FIG. 3, the phase relationships between $L_1$, $L_2$ and $L_3$ are illustrated. $L_1$, having a phase $\phi_1$, may be arbitrarily assigned a phase of 0 radians or 0 degrees. A phase $\phi_2$ of $L_2$ follows $\phi_1$, having a relative phase of about $$-\frac{2\pi}{3}$$

radians, or about −120 degrees. A phase $\phi_3$ of $L_3$ follows $\phi_2$, having a phase relative to $\phi=$ about $$-\frac{4\pi}{3}$$

radians, or about −240 degrees. The order of the phases of $L_1$, $L_2$ and $L_3$ may be represented as 123123 . . . . However, because the assignment of 0 radian phase is arbitrary, the phase order may be equivalently viewed as 123 . . . , 231 . . . or 312 . . . . These permutations of $L_1$, $L_2$ and $L_3$ are referred to herein as operable permutations. Various embodiments described herein may detect all of these operable permutations. Furthermore, as described below, various embodiments may detect any permutations of $L_1$, $L_2$ and $L_3$ that are not operable permutations. If a permutation other that those in the operable set is detected, the HVAC system 100 may be prevented from operating until the error is corrected. Thus, various components of the HVAC system 100 are protected from damage that may result from operation with an impermissible permutation of $L_1$, $L_2$ and $L_3$.

Figure 4:
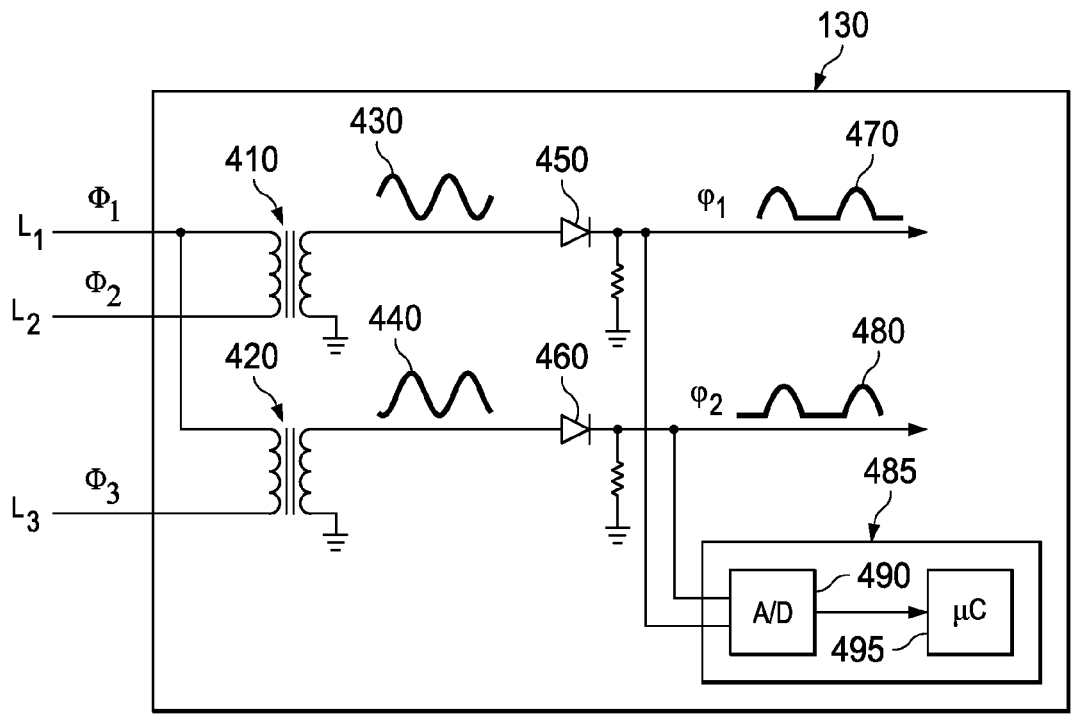
FIG. 4 illustrates half-wave rectification of step-down transformer outputs and a sampling and characterization subsystem of the disclosure.

Turning to FIG. 4, illustrated is an embodiment of the disclosure of the system controller 130. Transformers 410, 420 receive the three-phase power lines $L_1$, $L_2$ and $L_3$. The power lines $L_1$, $L_2$, $L_3$ typically carry a voltage of 208 VAC or greater to power various high-load HVAC devices such as the compressor 110. The voltage carried by the lines $L_1$, $L_2$, $L_3$ typically has a frequency of 50 Hz or 60 Hz, depending on the standard used by the utility providing the power. One or more transformers such as the transformers 410, 420 may be used to reduce, or step down, the voltage from the line voltage to a voltage compatible with control electronics associated with the system controller 130. For the purpose of discussion, without limitation the output voltage of the transformers 410, 420 is taken to be 24 VAC RMS. (Hereinafter all AC voltages are taken to be root-mean-square voltages unless expressly stated otherwise.) The transformer design may be different for different line voltage levels. For example, a transformer designed to step down 230 VAC to 24 VAC will typically have a different design than a transformer designed to reduce 460 VAC to 24 VAC.

One node of the primary coil of the transformer 410 is coupled to the $L_1$ line input, and the other node of the primary coil is coupled to the $L_2$ line input. A reduced-voltage output voltage 430 has a same frequency as the line inputs $L_1$, $L_2$. One node of the primary coil of the transformer 420 is coupled to the $L_1$ line input, and the other node of the primary coil is coupled to the $L_3$ line input. A reduced-voltage output voltage 440 has a same frequency as the line inputs $L_1$, $L_3$.

The output voltage 430 may be half-wave rectified by a diode 450 to produce a half-wave waveform 470. Similarly, the output voltage 440 may be half-wave rectified by a diode 460 to produce a half-wave waveform 480. Both the half-wave waveform 470 and the half-wave waveform 480 are also reduced-voltage waveforms. The waveforms 470, 480 may be used, e.g., to power various components of the HVAC system 100 such as control electronics, either directly or after further voltage conditioning such as capacitive filtering. The waveforms 470, 480 are characterized by a half-wave (positive) modulation above zero volts, with a peak value of the waveform 470 leading a peak value of the waveform 480 by about ⅙ of the period of the voltage provided via $L_1$, $L_2$ and $L_3$, e.g., about $$\frac{\pi}{3}$$

radians or about 60 degrees.

The system controller 130 includes a sampling and characterization subsystem 485. The subsystem 485 is configured to sample the waveforms 470, 480 and quantify figures of merit associated therewith, discussed below. In the illustrated embodiment the subsystem 485 includes an analog-to-digital converter (ADC) 490 and a microcontroller 495. While illustrated as separate components, the ADC 490 and the microcontroller 495 may be integrated in a single packaged device in some embodiments. The waveform 470 is input to a first input of the ADC 490, and the waveform 480 is output to a second input of the ADC 490. The ADC 490 is configured to cooperate with the microcontroller 495 to provide digitized samples of the waveforms 470, 480 thereto. The ADC 490 may include additional components such as an analog multiplexer to switch between the waveform 470 and the waveform 480 during sampling.

The microcontroller 495 may be any programmable state machine configurable to receive data from the ADC 490 and quantify therefrom figures of merit associated with the waveforms 470, 480. In various embodiments the microcontroller 495 is configured to execute instructions stored in memory, e.g., a program. The microcontroller 495 may also control the aspects of the operation of the ADC 490 to acquire samples of the waveforms 470, 480 at specific times or rates. The instructions may include any instructions to acquire and manipulate data, and to provide control outputs that may be used to control various operational aspects of the system 100.

In some embodiments the microcontroller 495 is used to control other aspects of the operation of the system 100, such as controlling the compressor 110 and the fan motor 120, or communicating over the communication network 170 with other HVAC components. However, embodiments are contemplated in which the microcontroller 495 is dedicated to the collection and characterization of data from the waveforms 470, 480.

In various embodiments the ADC 490 is configured to sample the instantaneous magnitude of the waveforms 470, 480 to produce a digital representation of the instantaneous values thereof. The sampled values may be used by the microcontroller 495 to determine a representation of the time-varying characteristics of the waveforms 470, 480. The microcontroller 495 in various embodiments is additionally configured to quantify figures of merit associated with the waveforms 470, 480 that may be used as proxies for characteristics of the power lines $L_1, L_2, L_3$.

Figure 5:
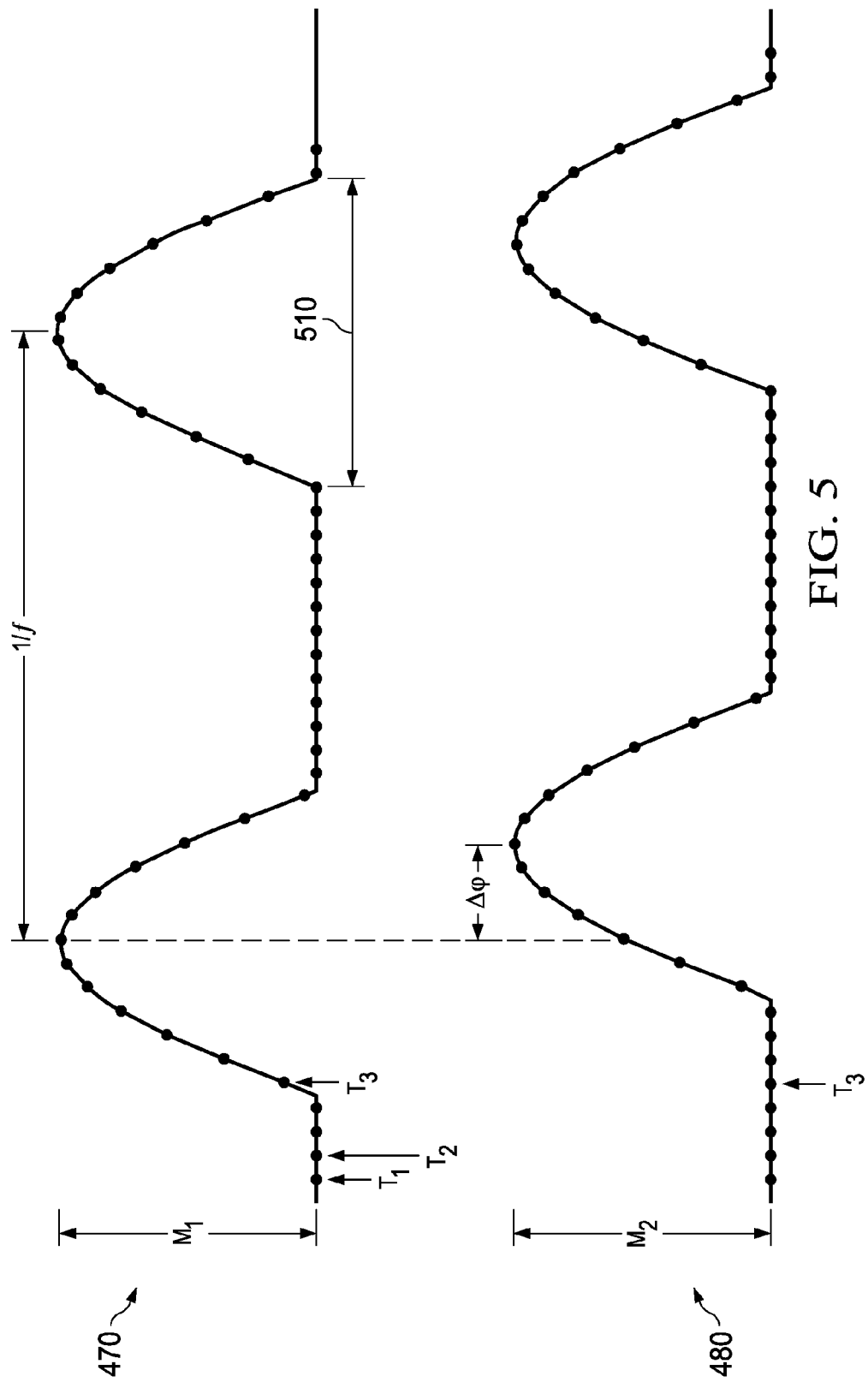

FIG. 5 illustrates one embodiment of a sampling scheme that may be carried out by the system controller 130. The waveform 470 is illustrated including two half-waves 510 having a magnitude $M_1$ and a period $1/f$, where f is the frequency of the waveform 470. In a nonlimiting example, the magnitude $M_1$ is about volts, corresponding to the peak voltage of a 24 VAC sine wave. In another nonlimiting example, the period $1/f$ is about 16.7 ms, equivalent to a line frequency of about 60 Hz. The ADC 490 acquires a first sample of the waveform 470 at a time $T_1$, and a second sample at a time $T_2$. The time $\Delta T = T_2 - T_1$ between the first and the second sample may be any desired value, but in various embodiments $\Delta T$ is advantageously selected to result in at least samples within the time span of the half-wave 510, e.g., about 20f. In applications requiring greater resolution of the sampled waveform, $\Delta T$ may be selected to acquire a sample at a rate at least about 40f.

The waveform 480 is also illustrated including two half-waves, and has a magnitude $M_2$. The waveform 480 may be sampled at a same or different time than the waveform 470, and at a same or different rate that the waveform 470. In various embodiments the waveform 480 is sampled after a small delay, e.g., a few microseconds, accounting for the time it takes a calling routine to return the sampled value of the waveform 470 and return to acquire a sample of the waveform 480.

In addition to the magnitudes $M_1, M_2$ and the frequency f, the waveforms 470, 480 may also be characterized by a phase difference $\Delta\phi$ as a figure of merit. In the illustrated embodiment, a peak of the waveform 480 lags a peak of the waveform 470 by $\Delta\phi$. The phase difference $\Delta\phi$ is also a phase difference of the output voltage 440 relative to the output voltage 430 (FIG. 4). This case represents a proper ordering of the phases of $L_1, L_2$ and $L_3$, e.g., the ordering illustrated by FIG. 2. The phase difference $\Delta\phi$ in this case is a consequence of the configuration of the transformers 410, 420, e.g., where $L_1$ is coupled to a first terminal of each transformer 410, 420, and $L_2$ and $L_3$ are respectively coupled to a second terminal of each transformer 410, 420.

An instruction program running on the microcontroller 495 may perform post-acquisition processing of the values sampled from the waveforms 470, 480 to quantify various figures of merit. Without limitation, such figures of merit may include the voltage magnitudes $M_1$, $M_2$, f, and the phase difference $\Delta\phi$ between the waveform 470 and the waveform 480. Any other figure of merit deemed to be useful in assessing the condition of the three-phase power lines 140 is within the scope of the disclosure. When desired, a figure of merit may be converted to a figure of merit of the line inputs $L_1, L_2, L_3$ using known deign parameters of the transformers 410, 420. The microcontroller 495 may then make various control decisions based on the values obtained for the desired figures of merit.

Figure 6:
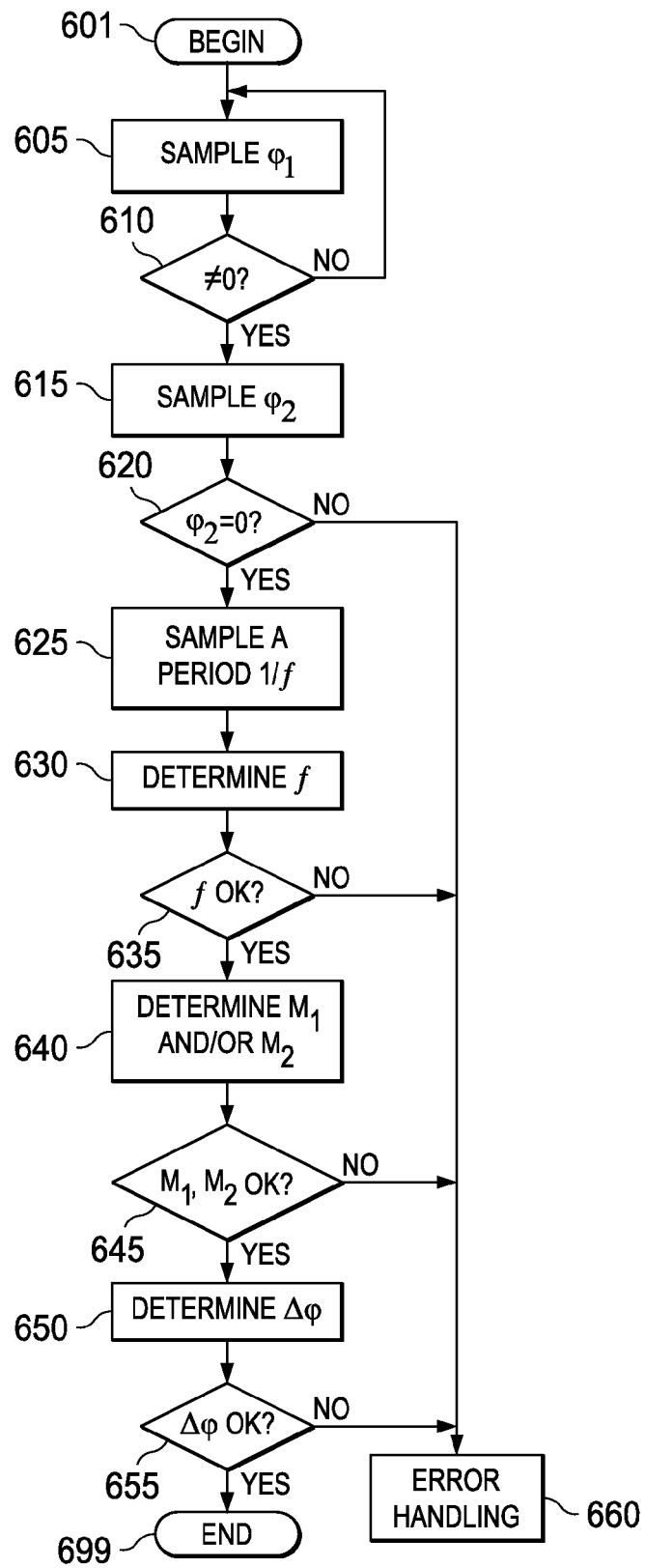
FIG. 6 is one embodiment of a method covered by the disclosure.

FIG. 6 illustrates an example embodiment of a method 600 configured to acquire digitized samples of the waveforms 470, 480 and perform quantitative analysis thereof. Those skilled in the pertinent art will recognize that the method 600 is one of many methods that may yield equivalent functionality of the system controller 130. Such equivalents are explicitly contemplated by the disclosure.

The method 600 begins with an entry state 601, which may be entered from any appropriate calling routine of an instruction program. In a step 605, a sample value of the waveform 470, represented as $\phi_1$, is acquired. In a step 610, the acquired value is tested to determine if it is nonzero. The test may include a noise threshold to account for the presence of noise on the waveform 470. In one embodiment, the noise threshold is ±10% of the expected value of $M_1$, e.g. about ±3.4 V. If the acquired value is zero, or within the range near zero treated as zero, then the method 600 returns to the step 605, at which another sample is acquired. Such a case is represented by the samples at $T_1$ and $T_2$ in FIG. 5.

When the acquired sample exceeds the noise threshold, as represented by the sample at $T_3$ in FIG. 5, then the method advances to a step 615. The value acquired at T3 is referred to as a first nonzero value of the waveform 470. In the step 615, a sample value of the waveform 480, represented as $\phi_2$, is acquired. In a step 620, if the value $\phi_2$ is zero, the method progresses to a step 625, discussed below. If the value $\phi_2$ is nonzero, an error condition is determined to have occurred, and the method advances to an error handling state 660.

The error condition detected by the occurrence of a nonzero value of $\phi_2$ simultaneously with the first nonzero value of $\phi_1$ may be interpreted as improper phasing of at least one of the line inputs $L_1, L_2, L_3$. As described previously, the phase difference $\Delta\phi$ illustrated in FIG. 5 represents the case that the waveform 480 lags the waveform 470. Such a case indicates that the line inputs $L_1, L_2, L_3$ are properly ordered, e.g., 123, 231 or 312.

FIG. 7 illustrates the waveform 470 and the waveform 480 for the case that the line inputs $L_1, L_2, L_3$ are arranged in other than an allowable order, e.g., 213, 132 or 321. In each of these cases, the peak of the waveform 480 leads a peak of the waveform 470 by about $$\frac{\pi}{3}$$

radians or about 60 degrees. Thus, the first nonzero value of the waveform 470 at the time T3 occurs when the value of the waveform 480 is nonzero. This combination of acquired values of the waveform 470 and the waveform 480 is a signature of improper ordering of the line inputs $L_1$, $L_2$, $L_3$.

Returning to FIG. 6, if the value of $\phi_2=0$ in the state 620, no error is deemed to have occurred and the method advances to a step 625. In the step 625 the waveforms 470, 480 are sampled for at least one period. In some cases, the waveforms are sampled for a time greater than a highest expected period to reduce any need for a priori knowledge of the period of the line voltage provided by the utility. The acquired data may be buffered in memory for various post-acquisition processing.

In a step 630, the frequency f of the line voltage inputs is determined. In one embodiment, the period 1/f between peaks of either the waveform 470 or the waveform 480 is determined, and the frequency computed therefrom. In another embodiment, the period of both of the waveforms 470, 480 is determined for confirmation of the determined frequency, and to ensure that the determination tests all three of the lines $L_1$, $L_2$, $L_3$. If in a decisional step 635 the frequency is determined to be within an allowable range, e.g., ±5% of an expected frequency, the method 600 advances to a step 640. Otherwise the method 600 advances to the error handling state 660.

In the step 640, the magnitude of at least one of the waveforms 470, 480 is determined. In one embodiment, the magnitude of both the waveforms 470, 480 is determined. As described earlier, the magnitude is expected to be about 34 V when the transformers 410, 420 provide 24 VAC. In an embodiment, $M_1$ is used to compute the line voltage of $L_1$, $L_2$, $L_3$ using known characteristics of the transformers 410, 420, and the computed value is compared to an expected value. If in a decisional step 645 the magnitude of the waveform 470 and/or the waveform 480 is within an allowable range, e.g., ±25% of an expected value, then the method 600 advances to a step 650. If instead the magnitude of one or both of the waveforms 470, 480 is not within the allowable range the method proceeds to the error handling state 660.

In the step 650, the phase lag $\Delta\phi$ between the waveform 470 and the waveform 480 is determined. This value may be computed from the measured time interval between a peak of the waveform 470 and the next peak of the waveform 480, and the period 1/f as determined by the interval between one peak of the waveform 470 and the next peak of the waveform 470. If in a decisional step 655 $\Delta\phi$ is within an allowable range, e.g., ±5% of an expected value, then the method 600 advances to an exit state 699. The expected value may be, e.g., about $$\frac{\pi}{3}$$

radians or about 60 degrees. If instead $\Delta\phi$ is not within the allowable range the method proceeds to the error handling state 660.

The method 600 may include comparing one or more of the figures of merit, e.g., frequency, magnitude and phase, to a stored configuration profile. Such a profile may be stored by the system controller 130, and may further be preconfigured by a manufacturer to include values reflecting a particular configuration of the system 100. For example, one configuration profile may include an expected frequency value of 60 Hz for a system intended for service in North America, while another configuration profile may include an expected frequency value of 50 Hz for a system intended for service in Europe. The configuration profile may be provided, e.g., by a pre-programmed nonvolatile memory installed by the manufacturer when the destination of the system 100 is determined.

In the error handling state 660, the method 600 may include various responses to error conditions determined from the various quantified figures of merit. The response may be to disable the operation of the system 100 until the condition is cleared, and may include recording the occurrence of the error and logging a time and date. The response may include generating a warning signal. The warning signal may include an audible warning, a visual warning, or a message sent via the network 170 to a listening device. A message may include a message configured to alert an operator, installer, or service provider of the error via email, MMS (multimedia messaging service) or paging device. In some cases, such as for minor or brief excursions of a figure of merit from an allowable operating range, the system 100 may be allowed to continue operating, while optionally generating a warning signal and/or error message and logging the event to memory.

The combination of keyed power connectors and monitoring of the input power lines provides a unique and highly applicable means of ensuring that proper power is delivered to the system 100. The keyed power connectors reduce the possibility of installation errors, either in a manufacturing setting or in the field, and the power monitoring provides visibility to errors connecting the system 100 to the utility lines, or to voltage or phase excursions in the power delivery system. In this manner, the possibility of damage to the system 100 is greatly reduced relative to conventional HVAC systems and operation, and user comfort and system reliability are enhanced.

Those skilled in the art to which this application relates will appreciate that other and further additions, deletions, substitutions and modifications may be made to the described embodiments.

What is claimed is:

1. An HVAC unit, comprising:
   a first transformer configured to receive power from a first and a second phase of a three-phase power source and to produce a first voltage waveform therefrom;
   a second transformer configured to receive power from said first and a third phase of said three-phase power source and to produce a second voltage waveform therefrom; and
   a system controller adapted to sample said voltage waveforms to determine a figure of merit of said three-phase power source, said system controller being further configured to operate said HVAC unit in response to said figure of merit.

2. The HVAC unit as recited in claim 1, wherein said figure of merit includes a phase difference between said first and second voltage waveforms.

3. The HVAC unit as recited in claim 1, wherein said system controller includes an analog-to-digital converter configured to cooperate with a microcontroller to provide digitized samples of said voltage waveform.

4. The HVAC unit as recited in claim 1, wherein said figure of merit includes a frequency of said three-phase power source.

5. The HVAC unit as recited in claim 1, wherein operating said HVAC unit in response to said figure of merit includes sending an alert message via a communications network.

6. The HVAC unit as recited in claim 1, wherein operating said HVAC unit in response to said figure of merit includes comparing said figure of merit to a stored configuration profile.

7. The method as recited in claim 1, wherein said first and second waveforms are reduced-voltage waveforms with respect to said three-phase power source.

8. A method of manufacturing an HVAC system, comprising:
   configuring an HVAC unit to receive three-phase power;
   adapting a system controller of said HVAC unit to:
      derive a first waveform from a first phase and a second phase of said three-phase power;
      derive a second waveform from said first and a third phase of said three-phase power; and
      quantify a figure of merit based on said first and second waveforms; and configuring said system controller to operate said HVAC unit in response to said figure of merit.

9. The method as recited in claim 8, wherein said first, second and third waveforms are half-wave waveforms.

10. The method as recited in claim 8, wherein said figure of merit includes a phase difference between said first waveform and said second waveform.

11. The method as recited in claim 8, wherein said figure of merit includes a frequency of said three-phase power.

12. The method as recited in claim 8, wherein said figure of merit includes a voltage magnitude of said power.

13. The method as recited in claim 8, wherein operating said HVAC unit in response to said figure of merit includes sending a alert message via a communications network.

14. The method as recited in claim 8, wherein operating said HVAC unit in response to said figure of merit includes comparing said figure of merit to a stored configuration profile.

15. An HVAC power protection system, comprising:
   a keyed connector block configured to receive three power phases from a three-phase power source;
   a keyed connector configured to mechanically couple to said keyed connector block and to electrically couple a first transformer to a first phase and a second phase of said three-phase power source;
   a controller subsystem configured to receive a first voltage waveform derived from an output of said first transformer and sample said first voltage waveform with an analog to digital converter;
   a microcontroller configured to receive a converted voltage from said analog to digital converter and quantify therefrom a figure of merit of said three-phase power source, said microcontroller being further configured to operate said HVAC unit in response to said figure of merit.

16. The power protection system as recited in claim 15, wherein said keyed connector is further configured to electrically couple a second transformer to said first phase and a third phase of said three-phase power source and to produce a second voltage waveform therefrom, and wherein said figure of merit includes a phase difference between said first and second voltage waveforms.

17. The power protection system as recited in claim 15, wherein said figure of merit includes a frequency of said three-phase power source.

18. The power protection system as recited in claim 15, wherein said figure of merit includes a voltage magnitude of said three-phase power source.

19. The power protection system as recited in claim 15, wherein operating said HVAC unit in response to said figure of merit includes sending an alert message via a communications network.

20. The power protection system as recited in claim 15, wherein operating said HVAC unit in response to said figure of merit includes comparing said figure of merit to a stored configuration profile.

* * * * *